(12) United States Patent
Hirai et al.

(10) Patent No.: US 6,395,598 B1
(45) Date of Patent: May 28, 2002

(54) SEMICONDUCTOR DEVICE AND METHOD FOR FABRICATING THE SAME

(75) Inventors: Takehiro Hirai, Shiga; Hiroyuki Kamada, Kyoto; Hiroyuki Kawahara, Toyama; Ichiro Nakao, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/454,594

(22) Filed: Dec. 7, 1999

(30) Foreign Application Priority Data

Dec. 8, 1998 (JP) .......................................... 10-348610

(51) Int. Cl.⁷ .......................................... H01L 21/8242
(52) U.S. Cl. ...................................... 438/242; 438/197
(58) Field of Search .................................. 438/197, 221, 438/242, 243, 245, 248, 249, 270, 391, 392, 422, 386

(56) References Cited

U.S. PATENT DOCUMENTS

| | | | | |
|---|---|---|---|---|
| 4,801,989 A | * | 1/1989 | Taguchi | 357/23.6 |
| 4,830,978 A | * | 5/1989 | Teng et al. | 357/23.4 |
| 4,978,634 A | * | 12/1990 | Shen et al. | 365/188 |
| 5,065,273 A | * | 11/1991 | Rajeevakumar | 361/313 |
| 6,064,107 A | * | 5/2000 | Yeh et al. | 257/522 |

FOREIGN PATENT DOCUMENTS

| | | |
|---|---|---|
| JP | 4-14226 | 1/1992 |
| JP | 5-198526 | 8/1993 |
| JP | 7-297396 | 11/1995 |
| JP | 8-162635 | 6/1996 |
| JP | 8-330588 | 12/1996 |
| JP | 9-8135 | 1/1997 |
| JP | 9-069627 | 3/1997 |
| JP | 9-293865 | 11/1997 |
| JP | 10-106968 | 4/1998 |
| JP | 10-209402 | 8/1998 |
| JP | 10-312975 | 11/1998 |

* cited by examiner

*Primary Examiner*—David Nelms
*Assistant Examiner*—David Nhu
(74) *Attorney, Agent, or Firm*—Eric J. Robinson; Nixon Peabody LLP

(57) ABSTRACT

A semiconductor device according to the present invention includes: a semiconductor substrate including an active region and an isolation region; an MIS transistor formed in the active region; a trench isolation structure formed in the isolation region; an insulating film covering both the MIS transistor and the trench isolation structure; and an interlevel dielectric film formed on the insulating film. An opening, which reaches part of source/drain doped regions of the MIS transistor and part of the trench isolation structure, is formed in the interlevel dielectric film. An electrode is formed to be in contact with the source/drain doped regions through the opening. The insulating film is made of a material making the insulating film function as etch stop layer for the interlevel dielectric film. A stepped portion is formed between the respective upper surfaces of the active region and the trench isolation structure. At least one of the source/drain doped regions reaches a side of the stepped portion. And an insulating sidewall spacer, which has been formed out of the insulating film, is inserted between the side of the stepped portion and the electrode.

9 Claims, 8 Drawing Sheets

SEMICONDUCTOR DEVICE AND METHOD FOR FABRICATING THE SAME

BACKGROUND OF THE INVENTION

1. Field of the Invention

The present invention relates to a semiconductor device such as MIS transistor and a method for fabricating the same.

2. Description of the Related Art

A LOCOS structure has been used widely to electrically isolate devices included in a semiconductor integrated circuit from each other. But this structure is not suited for isolating devices in a VLSI, because it is almost impossible to avoid a so-called "bird's beak" problem when the LOCOS structure is adopted. Thus, an STI (shallow trench isolation) structure was proposed as alternate isolation structure substituting for the LOCOS. The STI structure is formed by filling in relatively shallow trenches, which have been provided to a depth of about 0.2 to about 0.6 $\mu$m in respective regions of a silicon substrate for electrical isolation purposes, with an $SiO_2$ film.

The STI structure is effectively applicable instead of the LOCOS structure when the area of the source/drain regions is small, i.e., when the distance between an edge of the gate and that of the nearest part of the isolation region is short. Specifically, significant effects are attainable if the STI structure is applied to a semiconductor integrated circuit to electrically isolate very small sized transistors, in which the distance between the gate edge and isolation region edge is about 0.7 $\mu$m or less.

Hereinafter, a method for fabricating a conventional semiconductor device with the STI structure will be described with reference to FIGS. 1(a) through 1(d).

First, a structure shown in FIG. 1(a) is formed. This structure includes: a trench 10 that has been formed in an isolation region of a silicon substrate 1; and an $SiO_2$ film 11 that has been deposited to fill in the trench 10. The trench 10 and the $SiO_2$ film 11 together form an STI structure.

A region interposed between a pair of isolation regions functions as active region. The structure shown in FIG. 1(a) includes: a gate insulating film 2 formed in the active region; a gate electrode 3 formed over the gate insulating film 2; and source/drain regions 4 formed in the upper surface regions of the silicon substrate 1. And an MIS transistor is made up of these components 1, 2, 3 and 4. In FIG. 1(a), an $SiO_2$ film 5a is deposited to cover both the active and isolation regions alike.

Next, as shown in FIG. 1(b), the $SiO_2$ film 5a is etched back such that part of the $SiO_2$ film 5a is left on the side faces of the gate electrode 3, thereby forming a sidewall spacer 5b. Thereafter, dopant ions are implanted into the source/drain regions 4 using the gate electrode 3 and sidewall spacer 5b as mask. As a result, parts of the source/drain regions 4 are heavily doped, while other parts of the source/drain regions 4 located under the sidewall spacer 5b function as lightly doped drain (LDD) regions.

When the $SiO_2$ film 5a is etched back, however, the uppermost part of the STI structure, i.e., the uppermost part of the $Sio_2$ film 11 within the trench 10, is also etched un-intentionally. As a result, a level difference is caused between the upper surface of the active region and that of the $SiO_2$ film 11 in the isolation region. Specifically, the upper surface of the $SiO_2$ film 11 falls to a level lower than that of the active region. This level difference is estimated to be about 20 to about 100 nm.

Then, as shown in FIG. 1(c), these structures are covered with an interlevel dielectric film 6 and predetermined part of the interlevel dielectric film 6 is etched away, thereby forming a contact hole 12 in that part. As a result of this etching process step, the upper part of the $SiO_2$ film 11, which is exposed inside the contact hole 12 crossing both the active and isolation regions, is further etched away to increase the level difference up to about 50 to about 200 nm.

Recently, the junction depth of the source/drain regions 4 tends to be decreasing year after year. In a semiconductor device with the STI structure, where a great number of components are integrated, the junction depth of the source/drain regions 4 is now about 30 to about 150 nm, which is shallower than the level difference. Accordingly, in the process step shown in FIG. 1(c), the pn junction portion between the source/drain regions 4 and the silicon substrate 1 is exposed on a side of the stepped portion.

Subsequently, as shown in FIG. 1(d), the contact hole 12 of the interlevel dielectric film 6 is filled in with a metal plug 13 of tungsten, for example. The metal plug 13 is provided to electrically connect an upper-level interconnection layer (not shown) formed on the interlevel dielectric film 6 to the source/drain regions 4.

As shown in FIG. 1(d), part of the pn junction portion between the source/drain regions 4 and the silicon substrate 1 is in direct contact with the metal plug 13. As a result, a large amount of leakage current flows through a path indicated schematically by the arrow in FIG. 1(d).

FIGS. 2(a) and 2(b) illustrate a situation where relatively narrow contact holes 12 are formed over relatively wide source/drain regions 4 and filled in with metal plugs 13. Such a structure is applicable to a semiconductor device where a smaller number of components are integrated together. In this case, the metal plugs 13 are in contact with only the upper surface of the source/drain regions 4, not with the pn junction portion between the source/drain regions 4 and the silicon substrate 1. Thus, no leakage current flows through the metal plugs 13. If the distance Z shown in FIG. 2(b) is about 0.8 $\mu$m or more, then it is relatively easy to form the metal plugs 13 not reaching the nearest isolation regions filled in with the $SiO_2$ film 11. But when the number of components integrated increases so much as to make the distance Z less than 0.8, $\mu$m, it is difficult to form the metal plugs 13 not reaching the nearest isolation regions.

Also, in the structure shown in FIGS. 2(a) and 2(b), even when the interlevel dielectric film 6 is etched to form the contact holes, the $SiO_2$ film 11 inside the trenches is not etched, either. Furthermore, since the junction depth X of the source/drain regions 4 is relatively large in the prior art structure, the level difference Y between the upper surface of the active region 20 and that of the $SiO_2$ film 11 is smaller than the junction depth X. Thus, even if the contact hole has shifted so much as to make the metal plug 13 cross the boundary between the active and isolation regions, the pn junction portion between the source/drain regions 4 and the silicon substrate 1 does not come into contact with the metal plug 13. Accordingly, the leakage current path such as that shown in FIG. 1(d) was not formed in the prior art structure.

It is now clear, however, that the current leakage will be almost always caused through that path when the fabricating process shown in FIGS. 1(a) through 1(d) has to be adopted in the near future to catch up the everlasting downsizing trend of semiconductor devices.

SUMMARY OF THE INVENTION

An object of the present invention is eliminating current leakage, which usually results from a level difference between source/drain regions and an STI structure when a contact hole for connecting the source/drain regions to an interconnection layer crosses the boundary therebetween.

A semiconductor device according to the present invention includes: a semiconductor substrate including an active region and an isolation region; an MIS transistor formed in the active region; a trench isolation structure formed in the isolation region; an insulating film covering both the MIS transistor and the trench isolation structure; an interlevel dielectric film, which is formed on the insulating film and provided with an opening reaching part of source/drain doped regions of the MIS transistor and part of the trench isolation structure; and an electrode, which is in contact with the source/drain doped regions through the opening of the interlevel dielectric film. The insulating film is made of a material making the insulating film function as etch stop layer for the interlevel dielectric film. A stepped portion is formed between the respective upper surfaces of the active region and the trench isolation structure. At least one of the source/drain doped regions reaches a side of the stepped portion. An insulating sidewall spacer, which has been formed out of the insulating film, is inserted between the side of the stepped portion and the electrode.

In one embodiment of the present invention, the trench isolation structure is preferably made up of: a trench formed in the isolation region of the semiconductor substrate; and an insulator filled in the trench. And the material of the insulating film is preferably different from the insulator filled in the trench.

In this particular embodiment, the interlevel dielectric film and the insulator are preferably made of silicon dioxide films, while the insulating film is preferably made of a silicon nitride film.

In another embodiment, the semiconductor substrate is preferably a silicon substrate, and the source/drain doped regions are preferably defined in a semiconductor layer that has grown on the silicon substrate.

An inventive method for fabricating a semiconductor device includes the step of preparing a device prototype including: an MIS transistor formed in an active region of a semiconductor substrate; and a trench isolation structure formed in an isolation region of the semiconductor substrate. In the device prototype, a stepped portion is formed between the upper surface of the active region and that of the trench isolation structure and at least part of source/drain doped regions of the MIS transistor is exposed on a side of the stepped portion. The method further includes the steps of: depositing an insulating film as etch stop layer over the device prototype to cover the side of the stepped portion with the insulating film; depositing an interlevel dielectric film over the insulating film to cover the MIS transistor and the isolation structure with the interlevel dielectric film; etching part of the interlevel dielectric film that crosses the side of the stepped portion to such a depth as reaching the insulating film, thereby forming an opening in the interlevel dielectric film; etching anisotropically part of the insulating film that is exposed on the bottom of the opening of the interlevel dielectric film, thereby forming an insulating sidewall spacer out of the insulating film on the side of the stepped portion and partially exposing the upper surface of the source/drain doped regions; and forming an electrode that comes into contact with the part of the upper surface of the source/drain doped regions through the opening of the interlevel dielectric film.

According to the present invention, even if a level difference is caused in the boundary between source/drain regions and an STI structure where a contact hole crossing the boundary is formed to connect the source/drain regions to an interconnection line, current leakage, which usually result from the level difference, can be eliminated.

In one embodiment of the present invention, the trench isolation structure is preferably made up of: a trench formed in the isolation region of the semiconductor substrate; and an insulator filled in the trench. And the material of the insulating film is preferably different from the insulator filled in the trench.

In this particular embodiment, the interlevel dielectric film and the insulator are preferably made of silicon dioxide films, while the insulating film is preferably made of a silicon nitride film.

In another embodiment, the semiconductor substrate is preferably a silicon substrate, and the source/drain doped regions are preferably defined in a semiconductor layer that has grown on the silicon substrate.

Another inventive method for fabricating a semiconductor device includes the steps of: preparing a device prototype including an MIS transistor formed in an active region of a semiconductor substrate and a trench isolation structure that has been formed in an isolation region of the semiconductor substrate by filling in the isolation region with an insulator; depositing an undercoat insulating film over the device prototype to cover the MIS transistor and the isolation structure with the undercoat insulating film; forming a sidewall spacer over the sidewall of the MIS transistor with the undercoat insulating film interposed therebetween; depositing an etch stop layer over the undercoat insulating film and the sidewall spacer; depositing an interlevel dielectric film over the etch stop layer; etching part of the interlevel dielectric film that crosses a boundary between the active and isolation regions to such a depth as reaching the upper surface of the etch stop layer, thereby forming an opening in the interlevel dielectric film; etching the etch stop layer that is exposed inside the opening of the interlevel dielectric film, thereby exposing the undercoat insulating film located under the etch stop layer; etching the undercoat insulating film that is exposed inside the opening of the interlevel dielectric film to such a depth as reaching part of the upper surface of the source/drain doped regions of the MIS transistor; and forming an electrode that comes into contact with the part of the upper surface of the source/drain doped regions of the MIS transistor through the opening of the interlevel dielectric film.

According to the present invention, even if a contact hole crossing a boundary between source/drain regions and an STI structure is formed to connect the source/drain regions to an interconnection line, no level difference is caused in the boundary.

In one embodiment of the present invention, the insulator, the undercoat insulating film and the interlevel dielectric film are preferably made of silicon dioxide films, while the sidewall spacer and the etch stop layer are preferably made of silicon nitride films.

BRIEF DESCRIPTION OF THE DRAWINGS

FIG. 2(a) is a cross-sectional view illustrating a situation where relatively narrow contact holes are formed over relatively wide source/drain regions and filled in with metal plugs; and FIG. 2(b) is a plan view of the device.

DESCRIPTION OF THE PREFERRED EMBODIMENTS

Hereinafter, preferred embodiments of the present invention will be described with reference to the accompanying drawings.

Embodiment 1

A method for fabricating a semiconductor device according to a first exemplary embodiment of the present invention will be described with reference to FIGS. 3(a) through 4(b).

Figure 1A:
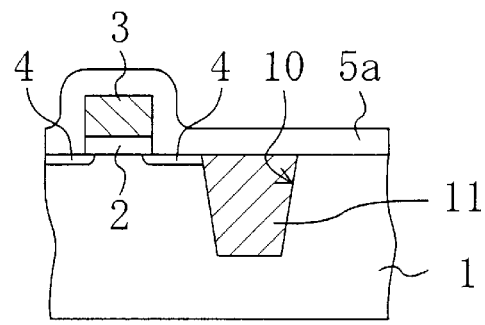
FIGS. 1(a) through 1(d) are cross-sectional views illustrating respective process steps for fabricating a conventional semiconductor device with an STI structure.
Figure 1B:
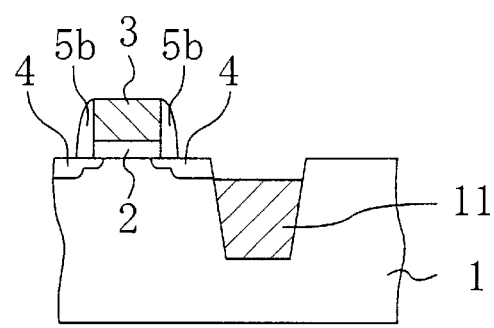
Figure 1C:
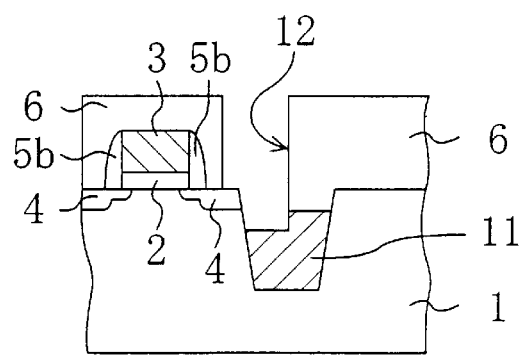
Figure 3A:
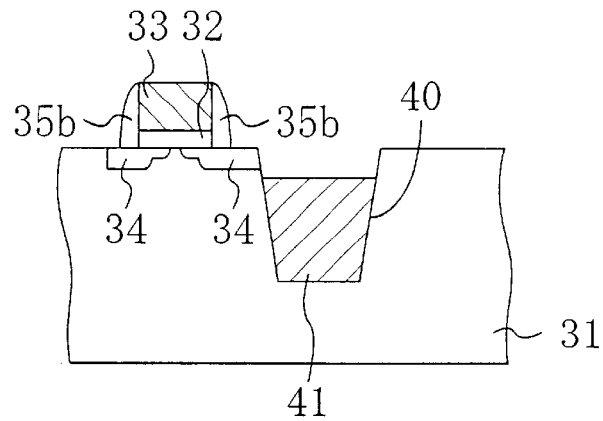
FIGS. 3(a) through 4(b) are cross-sectional views illustrating respective process steps for fabricating a semiconductor device according to a first embodiment of the present invention.

First, a structure shown in FIG. 3(a) is prepared by performing known process steps such as those illustrated in FIGS. 1(a) and 1(b). This structure includes: a trench 40, which has been formed in an isolation region of a p-type silicon substrate 31 to a depth of about 0.2 to about 0.6 $\mu$m; and an SiO$_2$ film 41 filled in the trench 40. The trench 40 and the SiO$_2$ film 41 together form an STI structure.

A region interposed between a pair of trenches 40 functions as active region. The structure shown in FIG. 3(a) includes: a gate insulating film 32 formed in the active region; a gate electrode 33 (gate length: about 0.13 to about 0.25 $\mu$m; gate width: about 2.0 $\mu$m) formed over the gate insulating film 32; and source/drain regions 34 formed in the upper parts of the active region. Each of the source/drain regions 34 consists of a lightly doped portion and a heavily doped portion. Both side faces of the gate electrode 33 are covered with a sidewall spacer 35b made of an SiO$_2$ film. An MIS transistor is made up of these components 31, 32, 33, 34 and 35b.

In the structure shown in FIG. 3(a), a level difference exists between the upper surface of the active region and that of the Sio$_2$ film 41, i.e., the upper surface of the SiO$_2$ film 41 is located at a level lower than that of the active region. According to this embodiment, the depth of the level difference at the process step shown in FIG. 3(a) is about 20 to about 100 nm, but is variable by about 50 nm depending on fabrication process conditions. The size of the source/drain regions 34 in the channel longitudinal direction (i.e., the size corresponding to the distance Z shown in FIG. 2b)) is about 0.1 to about 0.7 $\mu$m. And the junction depth is about 30 to about 150 nm.

Figure 3B:
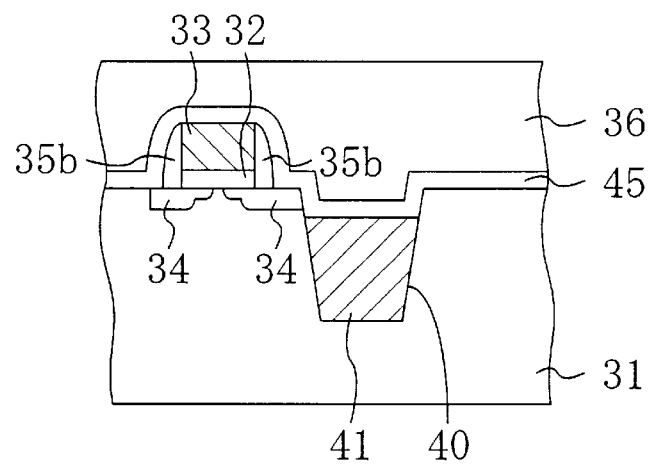

Next, as shown in FIG. 3(b), these structures are covered with an insulating film 45 (thickness: about 50 nm) of silicon nitride, for example, and then an interlevel dielectric film 36 (thickness: about 0.5 to about 1.0 $\mu$m) is deposited over the insulating film 45 by a CVD process, for instance. In this process step, the upper surface of the interlevel dielectric film 36 is preferably planarized by a chemical/mechanical polishing (CMP) process.

The insulating film 45 and the interlevel dielectric film 36 are made of mutually different materials. Specifically, the insulating film 45 is preferably made of such a material as making the insulating film 45 function as etch stop layer for the interlevel dielectric film 36 being etched. Where the interlevel dielectric film 36 is silicon dioxide film, organic film with a low relative dielectric constant or multilayer structure thereof, the insulating film 45 is preferably made of silicon nitride. This is because a high etch selectivity is easily attainable with such a combination. Also, the insulating film 45 is preferably a film with good step coverage, and therefore should preferably be deposited by a CVD process.

The insulating film 45 is provided to ensure good electrical insulation between the source/drain regions 34 and the metal plug. Accordingly, if the insulating film 45 is too thin, the insulation properties thereof deteriorate. For that reason, the insulating film 45 is at least required to be about 20 nm thick. If the insulating film 45 is too thick on the other hand, then it takes too long a time to over-etch the insulating film 45, thus possibly etching the SiO$_2$ film 41 excessively. Considering this point, the thickness of the insulating film 45 should preferably be about 100 nm or less. That is to say, the preferable thickness range of the insulating film 45 is from about 20 to about 100 nm.

Figure 3C:
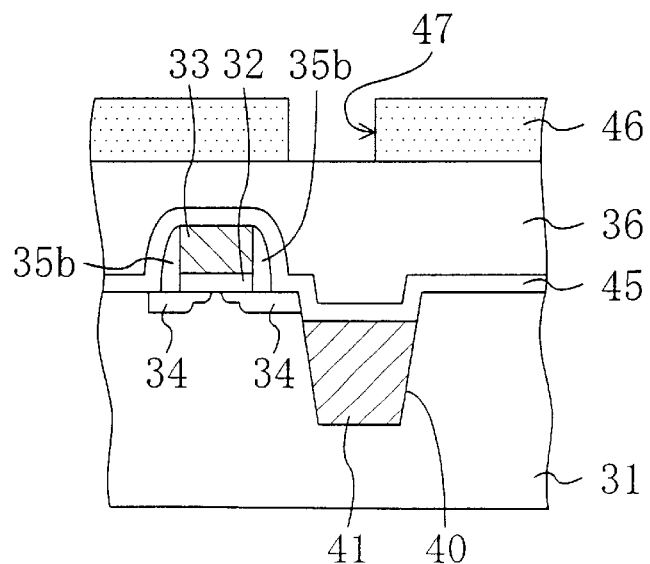
Figure 4A:
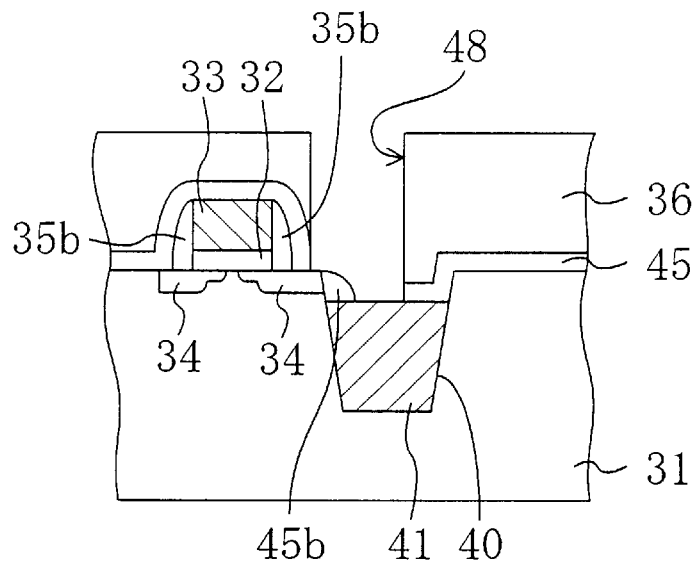

Subsequently, as shown in FIG. 3(c), a resist mask 46 with an opening 47 defining the location and shape of a contact hole is defined on the interlevel dielectric film 36 by a known lithography technique. Thereafter, the interlevel dielectric film 36 is etched using CF$_4$ gas as SiO$_2$ etching gas and applying a pressure of about 3 Pa and an RF power of about 500 W, thereby forming a contact hole 48 in the interlevel dielectric film 36 as shown in FIG. 4(a). This contact etching is performed until the upper surface of the insulating film 45 is exposed. According to this embodiment, the insulating film 45 is made of silicon nitride, and is hardly etched as a result of the contact etching process. Instead, the insulating film 45 functions as etch stop layer. Accordingly, an over-etching process may be performed, i.e., the contact etching process may be continued for an amount of time which is much greater in length than a time needed to etch away the interlevel dielectric film 36 completely. Thus, no SiO$_2$ film is left on the insulating film 45 that is exposed on the bottom of the contact hole 48.

Figure 2A:
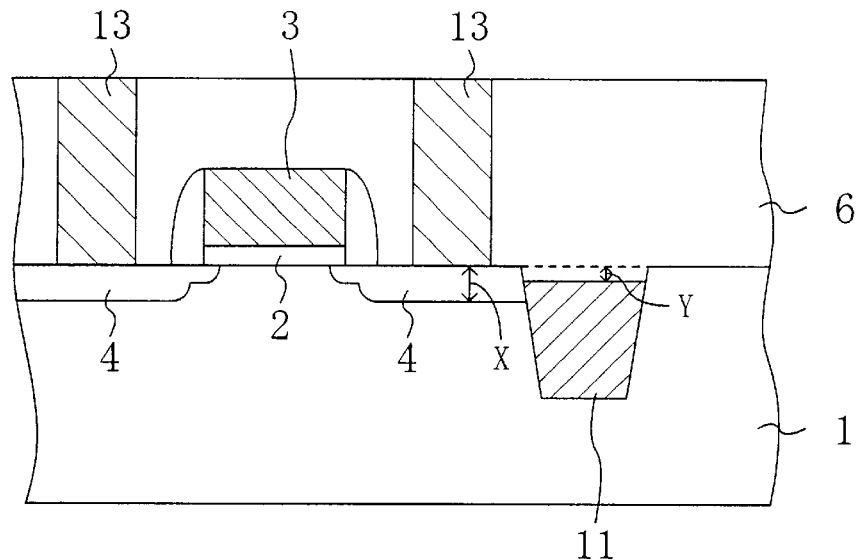
FIGS. 2(a) and 2(b) illustrate another conventional semiconductor device.
Figure 2B:
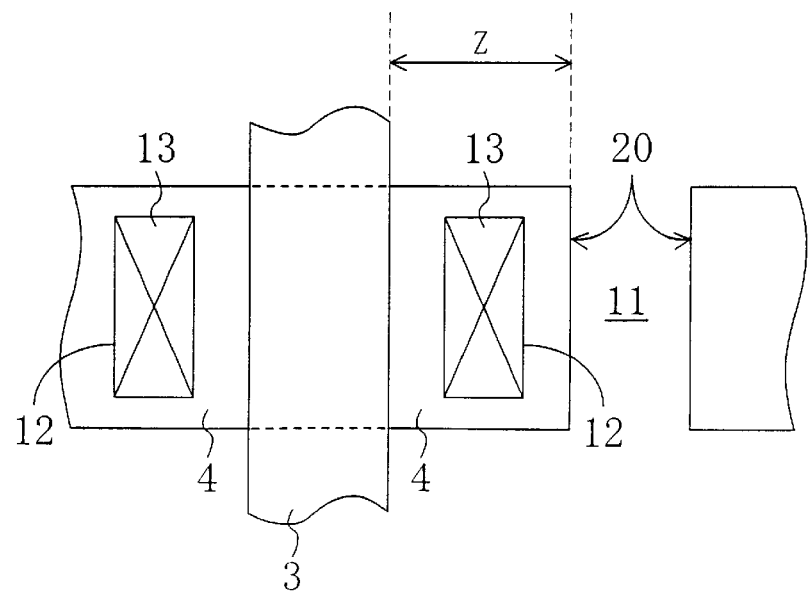

According to this embodiment, the size (or the diameter) of the contact hole 48 is defined within the range from about 0.16 to about 0.3 $\mu$m, which is about 50 to about 100% of the size of the source/drain regions 34 in the channel longitudinal direction (i.e., the size corresponding to the distance Z shown in FIG. 2(b)).

Next, the insulating film 45 is etched highly anisotropically. As a result of this etching, almost all the insulating film 45 located on the bottom of the contact hole 48 is removed, but part of the insulating film 45 located near the stepped portion is left as sidewall spacer 45b covering the side of the stepped portion as shown in FIG. 4(a). The thickness of the sidewall spacer 45b formed out of the insulating film 45 is about 20 to about 100 nm.

This anisotropic etching process may be performed using an SiN etching gas such as a mixture of Cl$_2$ and CHF$_3$ and applying a pressure of about 5 Pa and an RF power of about 250 W. Thus, the SiO$_2$ film 41 within the trench 40 is hardly etched. That is to say, the level difference shown in FIG. 3(a) does not increase its depth as a result of the etching process shown in FIG. 4a).

Figure 4B:
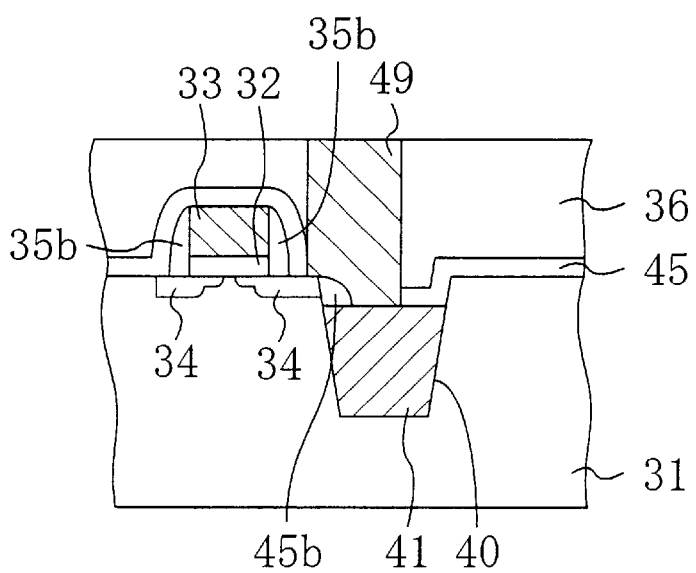

Then, as shown in FIG. 4(b), the contact hole 48 is filled in with a conductive plug 49 of tungsten, for example. This conductive plug 49 is provided as drain electrode for electrically connecting the source/drain regions 34 to an upper-level interconnection layer (not shown) formed on the interlevel dielectric film 36. The conductive plug 49 may be formed by depositing a tungsten film by a sputtering technique and then removing unnecessary parts thereof by a planarization technique such as CMP. Alternatively, the conductive plug 49 may be formed by a selective growth technique. At any rate, the conductive plug 49 is in electrical contact with the upper surface of the source/drain regions 34.

In the foregoing embodiment, the MIS transistor and the STI structure are covered with only the insulating film 45 (thickness: about 50 nm) of silicon nitride, for example. Optionally, an $SiO_2$ film (thickness: about 10 nm) may be additionally formed as undercoat film covering the MIS transistor and the STI structure.

Figure 1D:
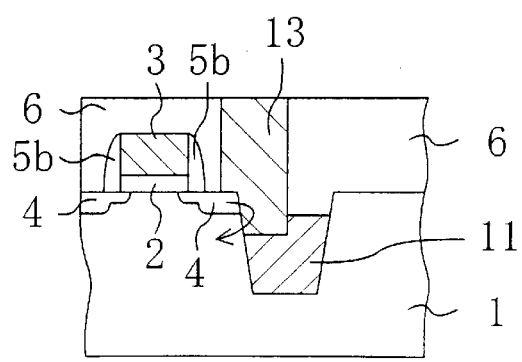

As can be seen, part of the pn junction portion between the source/drain regions 34 and the silicon substrate 31, which is located on the side of the stepped portion, is covered with the sidewall spacer 45b according to this embodiment. Thus, the pn junction portion between the source/drain regions 34 and the silicon substrate 31 is not in contact with the conductive plug 49. Since the sidewall spacer 45b has insulation properties, no leakage current flows through the path as schematically indicated by the arrow in FIG. 1(d).

Figure 5:
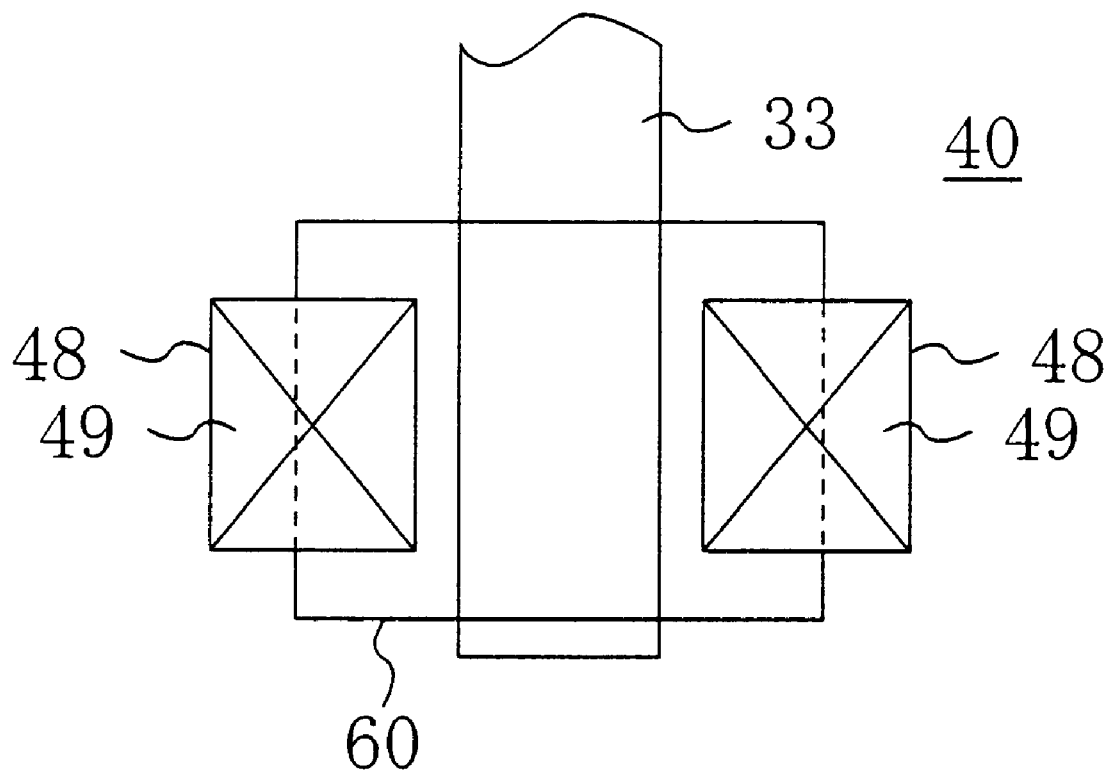
FIG. 5 is a plan view illustrating an exemplary planar layout for the semiconductor device according to the first embodiment.

Next, an exemplary planar layout for the semiconductor device according to this embodiment will be described with reference to FIG. 5. As shown in FIG. 5, an islandlike active region 60 is interposed between a pair of isolation regions, where the trench 40 with the STI structure is formed. Although just one active region 60 is illustrated in FIG. 5 for the sake of simplicity, a great number of active regions 60 are actually arranged on the silicon substrate 31. The gate electrode 33 functions not only as gate but also as interconnection line crossing the active regions 60. Each of the contact holes 48 is patterned so as to cross the boundary between the active region 60 and the associated trench 40. The electrical connection of the electrode to the source/drain regions is accomplished in the region where the active region 60 overlaps with the contact hole 48 (i.e., an actual contact region). The area of the actual contact region is smaller than the cross-sectional area of the contact hole. If the contact hole 48 should be formed so as not to go beyond the active region 60 and overlap with the trench 40, then the contact hole 48 has to be patterned so as to overlap with the gate electrode 33 or reduced to about half the size or less of that illustrated in FIG. 5. That is to say, it is difficult to make the contact hole 48 even smaller than the illustrated one. Accordingly, the contact hole 48 is preferably positioned over a relatively wide region crossing the boundary between the active region 60 and the isolation region as shown in FIG. 5.

Embodiment 2

Next, a method for fabricating a semiconductor device according to a second exemplary embodiment of the present invention will be described with reference to FIGS. 6(a) through 7(c).

Figure 6A:
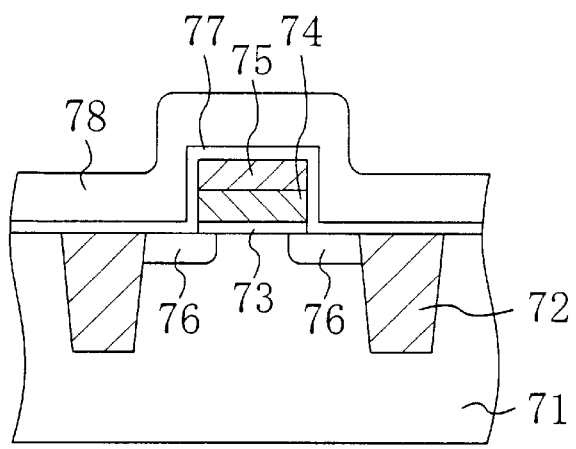
FIGS. 6(a) through 7(c) are cross-sectional views illustrating respective process steps for fabricating a semiconductor device according to a second embodiment of the present invention.

First, a structure shown in FIG. 6(a) is prepared. This structure includes: a trench, which has been formed in an isolation region of a silicon substrate 71 to a depth of about 0.4 μm; and an $SiO_2$ film 72 filled in the trench. The trench and the $SiO_2$ film 72 together form an STI structure. A region interposed between a pair of isolation regions functions as active region. The structure shown in FIG. 6(a) includes: a gate insulating film 73 formed in the active region; a gate electrode 74 formed over the gate insulating film 73; an insulating film 75 formed on the gate electrode 74; and source/drain regions 76 formed in the silicon substrate 71.

An MIS transistor is made up of these components 71, 73, 74, 75 and 76. Furthermore, an $SiO_2$ film 77 (thickness: about 10 nm) is formed as undercoat insulating film covering both the active and isolation regions. And a silicon nitride film 78 (thickness: about 50 nm), which will be shaped into a sidewall insulating film, is deposited on the $SiO_2$ film 77. The $SiO_2$ film 77 and the silicon nitride film 78 may be formed by a CVD process, for example. Alternatively, the $SiO_2$ film 77 may also be formed by a thermal oxidation technique.

Next, the silicon nitride film 78 is etched highly anisotropically. As a result, almost all the silicon nitride film 78 is removed, but part of the silicon nitride film 78 is left as sidewall spacer 78b on the sidewall of the gate electrode 74 and the insulating film 75 shown in FIG. 6(b). This anisotropic etching process is performed using an SiN etching gas such as a mixture of $Cl_2$ and $CHF_3$ and applying a pressure of about 5 Pa and an RF power of about 250 W. In this case, the size of the sidewall spacer 78b in the channel longitudinal direction is about 10 to about 50 nm. Under the etching conditions such as these, the $SiO_2$ film 77 located under the silicon nitride film 78 is hardly etched.

Figure 6B:
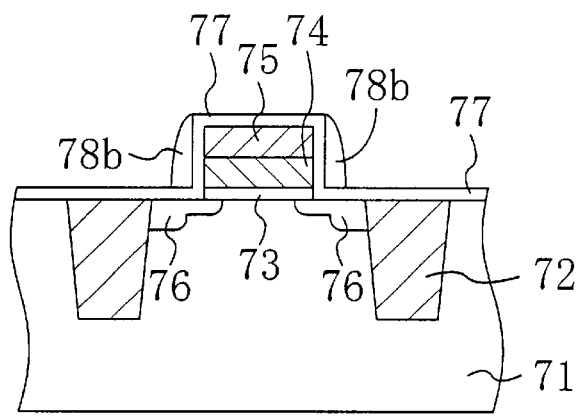
Figure 6C:
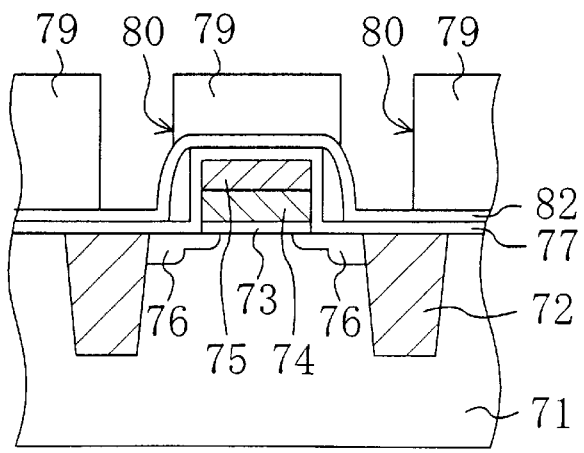

Then, as shown in FIG. 6(c), a second silicon nitride film 82 (thickness: about 50 nm) is deposited by a CVD process as etch stop layer covering the structure shown in FIG. 6(b). Thereafter, an interlevel dielectric film 79 (thickness: about 1 μm) is deposited thereon by a CVD process. Next, contact holes 80 are formed in the interlevel dielectric film 79 by lithography and etching techniques. In the planar layout, the contact holes 80 are formed in the respective locations shown in FIG. 6. The actual planar shape of the contact holes 80 does not have to be square, but may be circular or rectangular. The interlevel dielectric film 79 is etched to form the contact holes 80 using an $SiO_2$ etching gas such as $CF_4$ gas and applying a pressure of about 3 Pa and an RF power of about 500 W. Thus, the second silicon nitride film 82, which is the undercoat film of the interlevel dielectric film 79, is hardly etched, but functions as etch stop layer instead. That is to say, when the interlevel dielectric film 79 is completely etched, the second silicon nitride film 82 is exposed on the bottom of the contact holes 80.

Figure 7A:
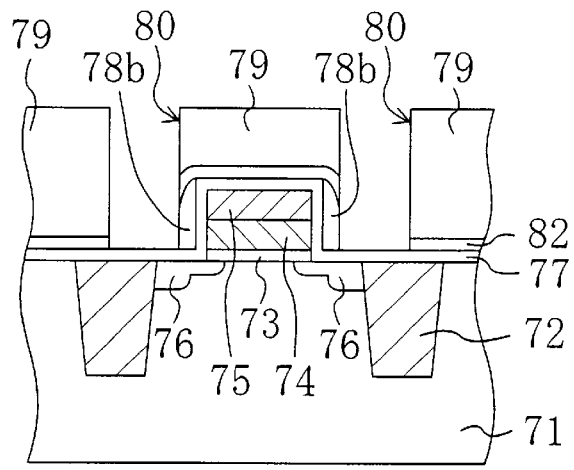

Subsequently, as shown in FIG. 7(a), parts of the second silicon nitride film 82, which are exposed on the bottom of the contact holes 80, are removed under highly anisotropic conditions so defined as to etch silicon nitride selectively. As a result, the upper surface of the $SiO_2$ film 77 is exposed on the bottom of the contact holes 80.

Figure 7B:
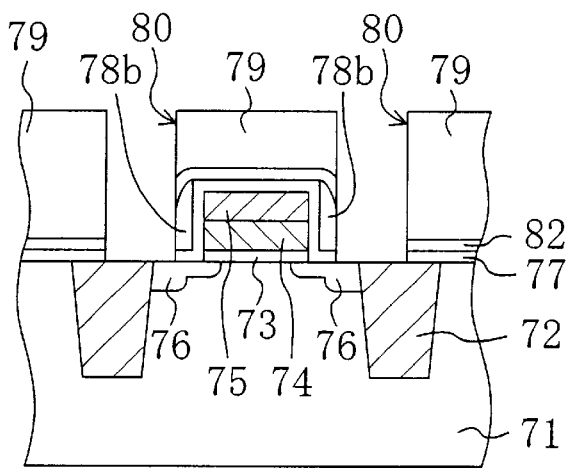

Thereafter, as shown in FIG. 7(b), the $SiO_2$ film 77 located on the bottom of the contact holes 80 is selectively etched, thereby exposing the source/drain regions 76 of the silicon substrate 71. The $SiO_2$ film 77 is relatively thin (e.g., about 10 nm), and can be removed almost completely from over the source/drain regions 76 in a short time. Thus, even if the $SiO_2$ film 77 is etched, the $SiO_2$ film 72 within the trenches is not etched deep. That is to say, no great level difference is caused between the upper surface of the source/drain regions 76 and that of the $SiO_2$ film 72 inside the trenches. Neither do the pn junction portions between the source/drain regions 76 and the silicon substrate 71 appear on the sides of the stepped portions. In other words, the pn junction portions between the source/drain regions 76 and the silicon substrate 71 are completely covered with the $SiO_2$ film 72 within the trenches.

Figure 7C:
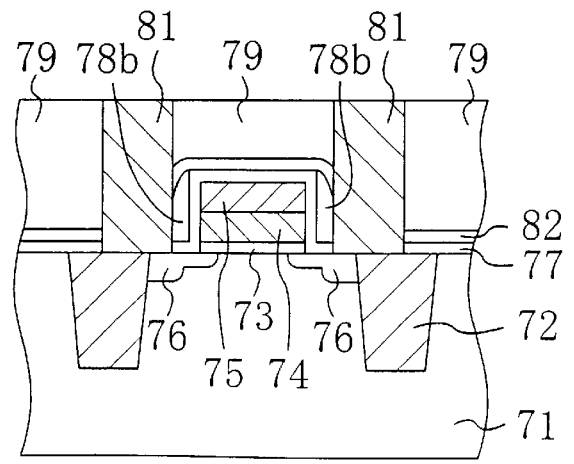

Finally, as shown in FIG. 7(c), the contact holes are filled in with metal plugs 81, thereby establishing electrical contact between the metal plugs 81 to be electrodes and the source/drain regions 76. As can be seen from FIG. 7(c), no leakage current path is formed between the source/drain regions 76 and the substrate 71 by way of the metal plugs 81.

The thickness of the SiO$_2$ film 77 is preferably about 10 to about 50 nm, while the thickness of the second silicon nitride film 82 is preferably about 20 to about 50 nm.

Embodiment 3

Next, a semiconductor device according to a third exemplary embodiment of the present invention will be described with reference to FIG. 8.

Figure 8:
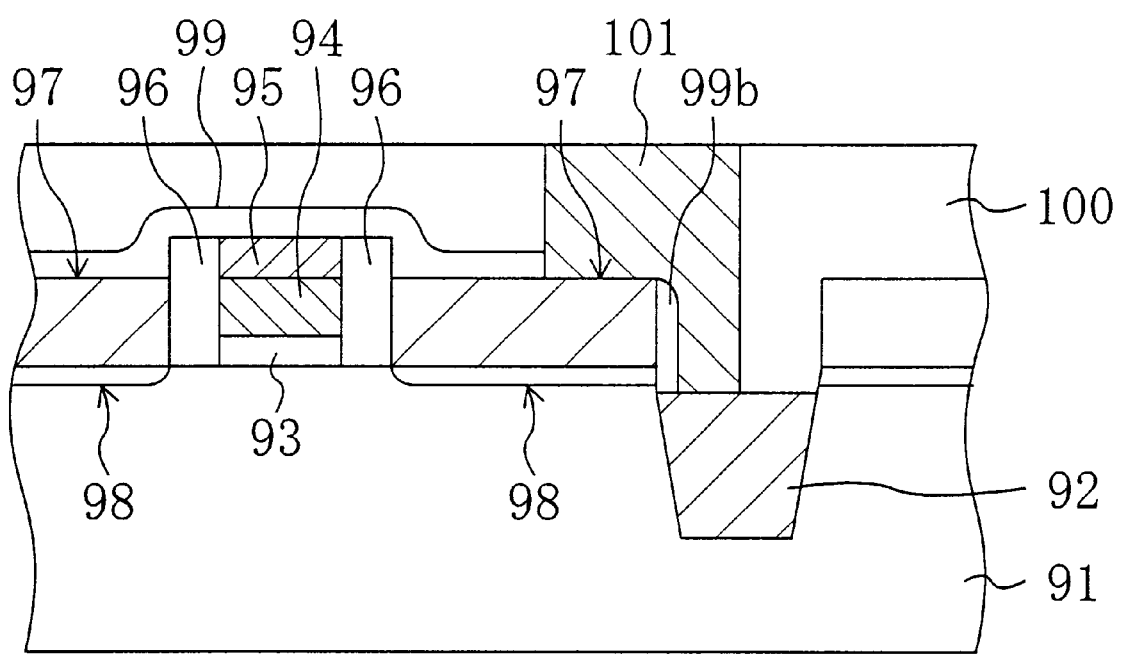
FIG. 8 is a cross-sectional view illustrating a semiconductor device according to a third embodiment of the present invention.

FIG. 8 illustrates a cross section of a semiconductor device, in which source/drain regions are formed in a silicon layer that has grown epitaxially on a silicon substrate.

As in the foregoing embodiments, this semiconductor device also includes: an MIS transistor formed in an active region of a p-type silicon substrate 91; and a trench isolation structure 92 formed in an isolation region thereof. In this specific embodiment, a silicon layer 97 has been grown epitaxially on the active region of the silicon substrate 91 and functions as source/drain regions of the MIS transistor.

The gate structure of the MIS transistor includes: a gate insulating film 93 formed on the silicon substrate 91; a gate electrode 94 formed on the gate insulating film 93; and an insulating layer 95 formed on the gate electrode 94. The side faces of the gate structure are covered with a sidewall insulating film 96. The MIS transistor and the trench isolation structure are covered with a relatively thin silicon nitride film 99 and a relatively thick interlevel dielectric film 100. An opening is formed in the interlevel dielectric film 100 and reaches part of the source/drain doped regions of the MIS transistor and part of the trench isolation structure. The opening 100 is filled in with an electrode plug 101, which is electrically connected to the source/drain doped regions.

In the structure shown in FIG. 8, an n-type dopant that has been doped into the silicon layer 97 diffuses to a certain depth inside the substrate 91 through the upper surface thereof to form pn junction portions 98 between the n-type source/drain doped regions and the substrate 91.

According to this embodiment, a stepped portion is formed between the upper surface of the active region and that of the trench isolation structure, and at least one of the source/drain doped regions reaches the side of the stepped portion. But an insulating sidewall spacer 99b made of the silicon nitride film 99 is inserted between the side of the stepped portion and the electrode plug 101. The insulating sidewall spacer 99b may be formed by a method similar to that illustrated in FIGS. 3(a) through 4(b).

Even in a semiconductor device with a "raised source/drain structure", where the source/drain regions are defined in the silicon layer 97 that has grown epitaxially on the active region of the silicon substrate 91, part of the pn junction portion between the source/drain regions and the silicon substrate 91, which is located on the side of the stepped portion, is covered with the insulating sidewall spacer 99b. Thus, the pn junction portion is not in direct contact with the electrode plug 101, and no leakage current flows through the path as schematically indicated by the arrow in FIG. 1(d).

What is claimed is:

1. A method for fabricating a semiconductor device, comprising the steps of:

a) preparing a device prototype including: an MIS transistor formed in an active region of a semiconductor substrate; and a trench isolation structure formed in an isolation region of the semiconductor substrate, where a stepped portion is formed between the respective upper surfaces of the active region and the trench isolation structure, with the step on the upper surface of the trench isolation structure lower than that of the active region, and at least part of source/drain regions of the MIS transistor is exposed on a side of the stepped portion;

b) after the step a), depositing an insulating film as etch stop layer over the semiconductor substrate including the device prototype;

c) depositing an interlevel dielectric film over the insulating film;

d) with the insulating film as etch stop layer, etching a portion of the interlevel dielectric film that covers across the upper region of a part of the source/drain regions and the upper region of a part of the trench isolation structure that resides beside the part of the source/drain regions, thereby forming an opening in the interlevel dielectric film;

e) etching anisotropically part of the insulating film that is exposed on the bottom of the opening formed in the interlevel dielectric film, thereby forming an insulating sidewall spacer out of the insulating film on the side of the stepped portion and partially exposing the upper surface of the source/drain regions; and f) forming an electrode that comes into contact with the source/drain regions through the opening formed in the interlevel dielectric film.

2. The method of claim 1, wherein the trench isolation structure is made up of: a trench formed in the isolation region of the semiconductor substrate; and an insulator filled in the trench, and wherein the material of the insulating film is different from the insulator filled in the trench.

3. The method of claim 2, wherein the interlevel dielectric film and the insulator are made of silicon dioxide films, while the insulating film is made of a silicon nitride film.

4. The method of claim 1, wherein the semiconductor substrate is a silicon substrate, and wherein the source/drain doped regions are defined in a semiconductor layer that has grown on the silicon substrate.

5. A method for fabricating a semiconductor device, comprising the steps of:

(a) forming a trench on an isolation region of a semiconductor substrate, a trench isolation structure out of an insulator buried within the trench, and an MIS transistor formed on an active region of the semiconductor substrate surrounded by the trench isolation structure;

(b) after the step (a), depositing an undercoat insulating film on the isolation region and the active region;

(c) after the step (b), forming a sidewall spacer over the sidewall of the MIS transistor;

(d) after the step (c), depositing an insulating film as etch stop layer over the undercoat insulating film and the sidewall spacer;

(e) depositing an interlevel dielectric film over the insulating film;

(f) with the insulating film as etch stop layer, etching a portion of the interlevel dielectric film that covers across the upper region of a part of the source/drain regions of the MIS transistor and the upper region of a part of the trench isolation structure that resides beside the part of the source/drain regions, thereby forming an opening in the interlevel dielectric film;

(g) etching part of the insulating film that is exposed on the bottom of the opening formed in the interlevel dielectric film, thereafter partially exposing the upper surface of the source/drain regions by etching the exposed undercoat insulating film; and (h) forming an electrode that comes into contact with the source/drain regions through the opening formed in the interlevel dielectric film.

6. The method of claim 5, wherein the step (d), the insulating film is formed directly on the sidewall spacer.

7. The method of claim 5, wherein the insulating film and the sidewall spacer are made of the same material.

8. The method of claim 5, wherein the interlevel dielectric film and the insulator are made of silicon dioxide films, while the insulating film and the sidewall spacer are made of silicon nitride film.

9. The method of claim 5, wherein in the step (f), the opening is formed over a part of the sidewall spacer, and in the step (g), the undercoat insulating film is exposed by partially exposing the upper surface of the source/drain regions, after respectively etching the part of the insulating film that is exposed on the bottom of the opening and removing the exposed sidewall spacer.

* * * * *